US011410977B2

(12) United States Patent
Brazzle et al.

(10) Patent No.: US 11,410,977 B2
(45) Date of Patent: Aug. 9, 2022

(54) ELECTRONIC MODULE FOR HIGH POWER APPLICATIONS

(71) Applicant: ANALOG DEVICES INTERNATIONAL UNLIMITED COMPANY, County Limerick (IE)

(72) Inventors: John D. Brazzle, Tracy, CA (US); Frederick E. Beville, San Jose, CA (US); Yucheng Ying, San Jose, CA (US); Zafer S. Kutlu, San Jose, CA (US)

(73) Assignee: Analog Devices International Unlimited Company, Limerick (IE)

( * ) Notice: Subject to any disclaimer, the term of this patent is extended or adjusted under 35 U.S.C. 154(b) by 240 days.

(21) Appl. No.: 16/681,136

(22) Filed: Nov. 12, 2019

(65) Prior Publication Data

US 2020/0152614 A1 May 14, 2020

Related U.S. Application Data

(60) Provisional application No. 62/760,641, filed on Nov. 13, 2018.

(51) Int. Cl.
*H01L 25/10* (2006.01)
*H01L 25/00* (2006.01)

(52) U.S. Cl.
CPC ............ *H01L 25/105* (2013.01); *H01L 25/50* (2013.01); *H01L 2225/1064* (2013.01); *H01L 2225/1094* (2013.01)

(58) Field of Classification Search
CPC ................... H01L 25/105; H01L 25/50; H01L 2225/1064; H01L 2225/1082
See application file for complete search history.

(56) References Cited

U.S. PATENT DOCUMENTS 4,089,041 A 5/1978 Lockard
4,739,125 A 4/1988 Watanabe et al.
(Continued)

FOREIGN PATENT DOCUMENTS

CN 101495014 7/2009
CN 104221145 12/2014
(Continued)

OTHER PUBLICATIONS

US 10,643,959 B2, 05/2020, Moussaouni et al. (withdrawn)
(Continued)

*Primary Examiner* — Thanh Y. Tran
(74) *Attorney, Agent, or Firm* — Knobbe Martens Olson & Bear LLP

(57) ABSTRACT

An electronic module can include a first integrated device package comprising a first substrate and an electronic component mounted to the first substrate. A first vertical interconnect can be mounted to and electrically connected to the first substrate. The first vertical interconnect can extend outwardly from the first substrate. The electronic module can include a second integrated device package comprising a second substrate and a second vertical interconnect having a first end mounted to and electrically connected to the second substrate. The second vertical interconnect can have a second end electrically connected to the first vertical interconnect. The first and second vertical interconnects can be disposed between the first and second substrates.

18 Claims, 8 Drawing Sheets

(56) References Cited

U.S. PATENT DOCUMENTS

| | | |
|---|---|---|
| 4,914,259 A | 4/1990 | Kobayashi et al. |
| 5,343,075 A | 8/1994 | Nishino |
| 5,485,037 A | 1/1996 | Marrs |
| 5,514,907 A | 5/1996 | Moshayedi |
| 5,535,101 A | 7/1996 | Miles et al. |
| 5,647,124 A | 7/1997 | Chan et al. |
| 5,706,172 A | 1/1998 | Lee |
| 7,129,420 B2 | 10/2006 | Hashimoto |
| 7,683,473 B2 | 3/2010 | Kasai et al. |
| 7,838,334 B2 | 11/2010 | Yu et al. |
| 7,982,139 B2 | 7/2011 | Kariya et al. |
| 8,193,034 B2 | 6/2012 | Pagaila et al. |
| 8,203,164 B2 | 6/2012 | Min et al. |
| 8,241,956 B2 | 8/2012 | Camacho et al. |
| 8,258,010 B2 | 9/2012 | Pagaila et al. |
| 8,283,750 B2 | 10/2012 | Guiraud et al. |
| 8,349,657 B2 | 1/2013 | Do et al. |
| 8,349,721 B2 | 1/2013 | Shim et al. |
| 8,383,457 B2 | 2/2013 | Pagaila et al. |
| 8,409,922 B2 | 4/2013 | Camacho et al. |
| 8,445,990 B2 | 5/2013 | Lin et al. |
| 8,502,387 B2 | 8/2013 | Choi et al. |
| 8,513,812 B2 | 8/2013 | Lin |
| 8,525,340 B2 | 9/2013 | Eckhardt et al. |
| 8,525,344 B2 | 9/2013 | Pagaila et al. |
| 8,530,274 B2 | 9/2013 | Pagaila |
| 8,563,418 B2 | 10/2013 | Pagaila et al. |
| 8,569,882 B2 | 10/2013 | Ko et al. |
| 8,581,381 B2 | 11/2013 | Zhao et al. |
| 8,623,702 B2 | 1/2014 | Pagaila |
| 8,624,374 B2 | 1/2014 | Ding et al. |
| 8,674,516 B2 | 3/2014 | Han et al. |
| 8,790,962 B2 | 7/2014 | Pagaila et al. |
| 8,847,369 B2 | 9/2014 | Yew et al. |
| 8,853,819 B2 | 10/2014 | Chen et al. |
| 8,877,567 B2 | 11/2014 | Lee et al. |
| 8,932,908 B2 | 1/2015 | Lee et al. |
| 8,941,222 B2 | 1/2015 | Hunt |
| 8,987,734 B2 | 3/2015 | Wang |
| 9,006,099 B2 | 4/2015 | Anderson et al. |
| 9,029,193 B2 | 5/2015 | Marimuthu et al. |
| 9,054,083 B2 | 6/2015 | Suthiwongsunthorn et al. |
| 9,059,186 B2 | 6/2015 | Shim et al. |
| 9,082,780 B2 | 7/2015 | Lin et al. |
| 9,105,532 B2 | 8/2015 | Choi et al. |
| 9,117,812 B2 | 8/2015 | Lee et al. |
| 9,129,980 B2 | 9/2015 | Khan et al. |
| 9,142,515 B2 | 9/2015 | Pagaila et al. |
| 9,171,792 B2 | 10/2015 | Sun et al. |
| 9,177,832 B2 | 11/2015 | Camacho |
| 9,236,332 B2 | 1/2016 | Pagaila et al. |
| 9,236,352 B2 | 1/2016 | Pagaila et al. |
| 9,240,331 B2 | 1/2016 | Kim et al. |
| 9,245,834 B2 | 1/2016 | Hsieh |
| 9,257,356 B2 | 2/2016 | Huang et al. |
| 9,257,411 B2 | 2/2016 | Pagaila et al. |
| 9,269,595 B2 | 2/2016 | Chi et al. |
| 9,275,877 B2 | 3/2016 | Lin et al. |
| 9,281,228 B2 | 3/2016 | Choi et al. |
| 9,299,650 B1 | 3/2016 | Chi et al. |
| 9,324,659 B2 | 4/2016 | Cho et al. |
| 9,331,002 B2 | 5/2016 | Pagaila et al. |
| 9,337,116 B2 | 5/2016 | Pagaila et al. |
| 9,343,387 B2 | 5/2016 | Hsu et al. |
| 9,373,578 B2 | 6/2016 | Choi et al. |
| 9,378,983 B2 | 6/2016 | Choi et al. |
| 9,379,064 B2 | 6/2016 | Oh et al. |
| 9,390,945 B2 | 7/2016 | Lee et al. |
| 9,391,046 B2 | 7/2016 | Park et al. |
| 9,397,074 B1 | 7/2016 | Lee et al. |
| 9,401,347 B2 | 7/2016 | Lee et al. |
| 9,406,552 B2 | 8/2016 | Chen et al. |
| 9,406,579 B2 | 8/2016 | Choi et al. |
| 9,406,636 B2 | 8/2016 | Zhao et al. |
| 9,406,658 B2 | 8/2016 | Lee et al. |
| 9,478,486 B2 | 10/2016 | Kim et al. |
| 9,484,259 B2 | 11/2016 | Lin et al. |
| 9,502,335 B2 | 11/2016 | Lai et al. |
| 9,508,626 B2 | 11/2016 | Pagaila et al. |
| 9,559,043 B2 | 1/2017 | Ye |
| 9,570,381 B2 | 2/2017 | Lu et al. |
| 9,589,910 B2 | 3/2017 | Pagaila et al. |
| 9,601,369 B2 | 3/2017 | Do et al. |
| 9,613,912 B2 | 4/2017 | Scanlan |
| 9,653,407 B2 | 5/2017 | Chen et al. |
| 9,679,881 B2 | 6/2017 | Pagaila et al. |
| 9,729,059 B1 | 8/2017 | Parto |
| 9,754,868 B2 | 9/2017 | Chiang et al. |
| 9,768,144 B2 | 9/2017 | Wu et al. |
| 9,799,621 B2 | 10/2017 | Lee et al. |
| 9,824,923 B2 | 11/2017 | Shariff et al. |
| 9,842,808 B2 | 12/2017 | Shin et al. |
| 9,847,324 B2 | 12/2017 | Lin et al. |
| 9,922,917 B2 | 3/2018 | Yu et al. |
| 9,922,955 B2 | 3/2018 | Camacho et al. |
| 9,966,335 B2 | 5/2018 | Cho et al. |
| 9,984,993 B2 | 5/2018 | Shu et al. |
| 9,991,193 B2 | 6/2018 | Essig et al. |
| 9,997,447 B1 | 6/2018 | Chen et al. |
| 10,032,652 B2 | 7/2018 | Hsu et al. |
| 10,096,578 B1 | 10/2018 | Yeh et al. |
| 10,115,661 B2 | 10/2018 | Doyle et al. |
| 10,115,701 B2 | 10/2018 | Zhao et al. |
| 10,157,821 B1 | 12/2018 | Liu |
| 10,157,887 B2 | 12/2018 | Chen et al. |
| 10,157,890 B2 | 12/2018 | Yu et al. |
| 10,163,867 B2 | 12/2018 | Kim et al. |
| 10,163,876 B2 | 12/2018 | Jeng et al. |
| 10,177,099 B2 | 1/2019 | Gerber et al. |
| 10,186,467 B2 | 1/2019 | Appelt et al. |
| 10,193,442 B2 | 1/2019 | Parto |
| 10,199,320 B2 | 2/2019 | Chiang et al. |
| 10,211,182 B2 | 2/2019 | Meyer et al. |
| 10,224,301 B2 | 3/2019 | Fang et al. |
| 10,229,859 B2 | 3/2019 | Wang |
| 10,229,892 B2 | 3/2019 | Appelt |
| 10,256,173 B2 | 4/2019 | Wu et al. |
| 10,269,771 B2 | 4/2019 | Lyu et al. |
| 10,276,382 B2 | 4/2019 | Hunt et al. |
| 10,297,518 B2 | 5/2019 | Lin et al. |
| 10,297,519 B2 | 5/2019 | Lin |
| 10,325,868 B2 | 6/2019 | Tsai |
| 10,332,862 B2 | 6/2019 | Chen et al. |
| 10,361,150 B2 | 7/2019 | Chung et al. |
| 10,381,300 B2 | 8/2019 | Kao et al. |
| 10,388,598 B2 | 8/2019 | Lu et al. |
| 10,403,609 B2 | 9/2019 | Geissler et al. |
| 10,410,970 B1 | 9/2019 | Chiu et al. |
| 10,418,314 B2 | 9/2019 | Lu |
| 10,446,411 B2 | 10/2019 | Chen et al. |
| 10,453,785 B2 | 10/2019 | Shim et al. |
| 10,453,802 B2 | 10/2019 | Hu |
| 10,497,635 B2 | 12/2019 | Brazzle et al. |
| 10,510,703 B2 | 12/2019 | Chi et al. |
| 10,510,720 B2 | 12/2019 | Lin et al. |
| 10,515,806 B2 | 12/2019 | Hunt et al. |
| 10,515,889 B2 | 12/2019 | Lu |
| 10,522,476 B2 | 12/2019 | Cheng et al. |
| 10,535,521 B2 | 1/2020 | Hunt et al. |
| 10,535,597 B2 | 1/2020 | Chen et al. |
| 10,548,249 B2 | 1/2020 | Mokler et al. |
| 10,553,487 B2 | 2/2020 | Zhao et al. |
| 10,573,624 B2 | 2/2020 | Chen et al. |
| 10,586,751 B2 | 3/2020 | Huang |
| 10,602,612 B1 | 3/2020 | Hoang et al. |
| 10,607,955 B2 | 3/2020 | Chiu et al. |
| 10,629,454 B2 | 4/2020 | Yeh |
| 10,629,531 B2 | 4/2020 | Lin |
| 10,636,756 B2 | 4/2020 | Yang et al. |
| 2004/0262774 A1 | 12/2004 | Kang et al. |
| 2005/0095835 A1 | 5/2005 | Humpston et al. |
| 2007/0114352 A1 | 5/2007 | Cruz et al. |
| 2007/0222044 A1 | 9/2007 | Otremba |
| 2007/0246806 A1 | 10/2007 | Ong et al. |

(56) References Cited

U.S. PATENT DOCUMENTS

| | | |
|---|---|---|
| 2007/0262346 A1 | 11/2007 | Otremba et al. |
| 2007/0273049 A1 | 11/2007 | Khan et al. |
| 2008/0128890 A1 | 6/2008 | Choi et al. |
| 2010/0013064 A1 | 1/2010 | Hsu |
| 2010/0133674 A1 | 6/2010 | Hebert et al. |
| 2011/0013349 A1 | 1/2011 | Morikita et al. |
| 2011/0115060 A1 | 5/2011 | Chiu et al. |
| 2011/0177654 A1 | 7/2011 | Lee et al. |
| 2011/0241194 A1 | 10/2011 | Chen et al. |
| 2011/0266699 A1 | 11/2011 | Hilt et al. |
| 2011/0292632 A1 | 12/2011 | Wen et al. |
| 2012/0025227 A1 | 2/2012 | Chan et al. |
| 2012/0074532 A1 | 3/2012 | Shih et al. |
| 2012/0139122 A1 | 6/2012 | Honjo |
| 2012/0181689 A1 | 7/2012 | Do et al. |
| 2012/0223428 A1 | 9/2012 | Pendse |
| 2012/0273960 A1 | 11/2012 | Park et al. |
| 2013/0015569 A1 | 1/2013 | Anderson et al. |
| 2013/0200527 A1 | 8/2013 | Yang et al. |
| 2013/0214399 A1 | 8/2013 | Joshi et al. |
| 2013/0234324 A1 | 9/2013 | Cho et al. |
| 2013/0249051 A1 | 9/2013 | Saye |
| 2013/0299971 A1 | 11/2013 | Do et al. |
| 2013/0341786 A1* | 12/2013 | Hsu .................. H01L 25/105 257/737 |
| 2014/0110860 A1 | 4/2014 | Choi et al. |
| 2014/0124919 A1 | 5/2014 | Huang et al. |
| 2014/0138807 A1 | 5/2014 | Gowda et al. |
| 2014/0145319 A1 | 5/2014 | Meinhold et al. |
| 2014/0151880 A1 | 6/2014 | Kao et al. |
| 2014/0154843 A1 | 6/2014 | Liu et al. |
| 2014/0159251 A1 | 6/2014 | Marimuthu et al. |
| 2014/0312503 A1 | 10/2014 | Seo |
| 2014/0361423 A1 | 12/2014 | Chi et al. |
| 2015/0061095 A1 | 3/2015 | Choi et al. |
| 2015/0084206 A1 | 3/2015 | Lin |
| 2015/0179570 A1 | 6/2015 | Marimuthu et al. |
| 2015/0179626 A1 | 6/2015 | Zhang et al. |
| 2015/0187710 A1 | 7/2015 | Scanlan et al. |
| 2015/0255360 A1 | 9/2015 | Hsu et al. |
| 2015/0279778 A1 | 10/2015 | Camacho et al. |
| 2015/0279815 A1 | 10/2015 | Do et al. |
| 2015/0325509 A1 | 11/2015 | We et al. |
| 2015/0325516 A1 | 11/2015 | Lin et al. |
| 2016/0035656 A1 | 2/2016 | Haba et al. |
| 2016/0066406 A1 | 3/2016 | Chen et al. |
| 2016/0071831 A1 | 3/2016 | Lee et al. |
| 2016/0126176 A1 | 5/2016 | Chang et al. |
| 2016/0150632 A1 | 5/2016 | Viswanathan et al. |
| 2016/0276256 A1 | 9/2016 | Chiang et al. |
| 2016/0284642 A1 | 9/2016 | Ganesan et al. |
| 2016/0307799 A1 | 10/2016 | Ho et al. |
| 2016/0322343 A1 | 11/2016 | Scanlan |
| 2016/0329272 A1 | 11/2016 | Geissler et al. |
| 2016/0343651 A1 | 11/2016 | Rae et al. |
| 2017/0011936 A1 | 1/2017 | Lin et al. |
| 2017/0062120 A1 | 3/2017 | Yun et al. |
| 2017/0077039 A1 | 3/2017 | Liao et al. |
| 2017/0077364 A1 | 3/2017 | Renn et al. |
| 2017/0098610 A1 | 4/2017 | Shim et al. |
| 2017/0110392 A1 | 4/2017 | Lin et al. |
| 2017/0148746 A1 | 5/2017 | Chiu et al. |
| 2017/0162476 A1 | 6/2017 | Meyer et al. |
| 2017/0179041 A1 | 6/2017 | Dias et al. |
| 2017/0179048 A1 | 6/2017 | Moussaoui et al. |
| 2017/0186702 A1 | 6/2017 | Liang et al. |
| 2017/0221858 A1 | 8/2017 | Yu et al. |
| 2017/0250172 A1 | 8/2017 | Huang et al. |
| 2017/0256481 A1 | 9/2017 | Chen et al. |
| 2017/0278807 A1 | 9/2017 | Chiu et al. |
| 2017/0311447 A1 | 10/2017 | Brazzle et al. |
| 2018/0052281 A1 | 2/2018 | Kuo et al. |
| 2018/0061815 A1 | 3/2018 | Fang et al. |
| 2018/0068970 A1 | 3/2018 | Tanida et al. |
| 2018/0068983 A1 | 3/2018 | Chang et al. |
| 2018/0076165 A1 | 3/2018 | Aoki et al. |
| 2018/0090466 A1 | 3/2018 | Hung |
| 2018/0102325 A1 | 4/2018 | Yu et al. |
| 2018/0130774 A1 | 5/2018 | Lin et al. |
| 2018/0138113 A1 | 5/2018 | Chen et al. |
| 2018/0138131 A1 | 5/2018 | Kawabata |
| 2018/0151485 A1 | 5/2018 | Kao et al. |
| 2018/0158779 A1 | 6/2018 | Yang et al. |
| 2018/0182704 A1 | 6/2018 | Yeh |
| 2018/0261551 A1 | 9/2018 | Lee et al. |
| 2018/0269708 A1 | 9/2018 | Yeh |
| 2018/0297834 A1 | 10/2018 | Renaud-Bezot et al. |
| 2018/0331018 A1 | 11/2018 | Shim et al. |
| 2018/0331050 A1 | 11/2018 | Chung et al. |
| 2018/0337130 A1 | 11/2018 | Chang Chien et al. |
| 2018/0342484 A1 | 11/2018 | Chiu et al. |
| 2018/0350766 A1 | 12/2018 | Sato et al. |
| 2018/0374798 A1 | 12/2018 | Lee et al. |
| 2018/0374833 A1 | 12/2018 | Wong et al. |
| 2019/0013301 A1 | 1/2019 | Cheah et al. |
| 2019/0019763 A1 | 1/2019 | Chang et al. |
| 2019/0043819 A1 | 2/2019 | Ho et al. |
| 2019/0051590 A1 | 2/2019 | Fang et al. |
| 2019/0057940 A1 | 2/2019 | Cheah et al. |
| 2019/0115319 A1 | 4/2019 | Hiner et al. |
| 2019/0132983 A1 | 5/2019 | Weis et al. |
| 2019/0139846 A1 | 5/2019 | Lu |
| 2019/0139946 A1 | 5/2019 | Kim et al. |
| 2019/0141834 A1 | 5/2019 | Brazzle et al. |
| 2019/0148304 A1 | 5/2019 | Gavagnin et al. |
| 2019/0206799 A1 | 7/2019 | Keser et al. |
| 2019/0237374 A1 | 8/2019 | Huang et al. |
| 2019/0252305 A1 | 8/2019 | Peng et al. |
| 2019/0273044 A1 | 9/2019 | Fu et al. |
| 2019/0304807 A1 | 10/2019 | Baloglu et al. |
| 2019/0304865 A1 | 10/2019 | Brazzle et al. |
| 2019/0304936 A1 | 10/2019 | Shaul et al. |
| 2019/0319337 A1 | 10/2019 | Yen |
| 2019/0355654 A1 | 11/2019 | Xu et al. |
| 2019/0363423 A1 | 11/2019 | Lu et al. |
| 2019/0371621 A1 | 12/2019 | Darmawikarta et al. |
| 2019/0393140 A1 | 12/2019 | Yeh et al. |
| 2020/0006089 A1 | 1/2020 | Yu et al. |
| 2020/0006253 A1 | 1/2020 | Cheah et al. |
| 2020/0006295 A1 | 1/2020 | Yang et al. |
| 2020/0051927 A1 | 2/2020 | Lin et al. |
| 2020/0075490 A1 | 3/2020 | Sung et al. |
| 2020/0075562 A1 | 3/2020 | Yu et al. |
| 2020/0083591 A1 | 3/2020 | Hsieh et al. |
| 2020/0091059 A1 | 3/2020 | Lin et al. |
| 2020/0105653 A1 | 4/2020 | Elsherbini et al. |
| 2020/0111717 A1 | 4/2020 | Gmunder et al. |
| 2020/0111748 A1 | 4/2020 | Leitgeb |
| 2020/0120794 A1 | 4/2020 | Somada et al. |
| 2020/0126921 A1 | 4/2020 | Nair et al. |
| 2020/0144198 A1 | 5/2020 | Lee et al. |
| 2020/0185293 A1 | 6/2020 | Schmalzl et al. |
| 2020/0185330 A1 | 6/2020 | Yu et al. |
| 2020/0205279 A1 | 6/2020 | Ecton et al. |
| 2020/0211927 A1 | 7/2020 | Wan et al. |
| 2021/0111084 A1 | 4/2021 | Brazzle et al. |
| 2021/0378098 A1 | 12/2021 | Brazzle et al. |

FOREIGN PATENT DOCUMENTS

| | | |
|---|---|---|
| CN | 104934391 | 9/2015 |
| CN | 109075151 | 12/2018 |
| CN | 110299329 | 10/2019 |
| CN | 110364491 | 10/2019 |
| CN | 111108598 | 5/2020 |
| CN | 111149201 | 5/2020 |
| EP | 0384927 | 9/1990 |
| EP | 2381472 | 10/2011 |
| EP | 3217774 | 9/2017 |
| JP | S59-155154 | 9/1984 |
| KR | 20200010521 | 1/2020 |
| WO | WO 2010/067508 | 6/2010 |
| WO | WO 2017/189224 | 11/2017 |
| WO | WO 2019/066986 | 4/2019 |

(56) References Cited

FOREIGN PATENT DOCUMENTS

| WO | WO 2019/066987 | 4/2019 |
|---|---|---|
| WO | WO 2019/132963 | 7/2019 |
| WO | WO 2019/132965 | 7/2019 |

OTHER PUBLICATIONS

Partial Search Report in European Application No. 21175552.5, dated Oct. 29, 2021, in 11 pages.
Office Action in Chinese Application No. 201780025431.5, dated Nov. 30, 2021.
International Search Report and Written Opinion for International Application No. PCT/US2019/021908, dated Aug. 27, 2019, in 16 pages.
International Search Report and Written Opinion for application No. PCT/US2017/027047, dated Jun. 29, 2017, in 10 pages.
International Preliminary Report on Patentability for application No. PCT/US2017/027047, dated Oct. 30, 2018, in 7 pages.
International Preliminary Report on Patentability for application No. PCT/US2019/021908, dated Sep. 29, 2020, in 9 pages.
Final Office Action in U.S. Appl. No. 15/495,405, dated Oct. 18, 2018, in 17 pages.
Non-Final Office Action in U.S. Appl. No. 15/495,405, dated Apr. 5, 2018, in 12 pages.
Response in U.S. Appl. No. 15/495,405, filed Jun. 12, 2018, in 8 pages.
Office Action in Taiwan Application No. 106113400, dated Jul. 4, 2018, with concise statement of relevance, in 5 pages.
Response in Taiwan Application No. 106113400, filed Jan. 9, 2019, with English claims, in 4 pages.
Office Action in Taiwan Application No. 106113400, dated Jan. 16, 2019, in 10 pages.
Response in Taiwan Application No. 106113400, filed Apr. 3, 2019, with English claims, in 16 pages.
Office Action in Taiwan Application No. 106113400, dated Apr. 29, 2019, with English translation, in 4 pages.
Response to Communication Pursuant to Rules 161(1) and 162 EPC, with English Claims, in European Application No. 17719130.1, filed Jun. 3, 2019, in 24 pages.

\* cited by examiner

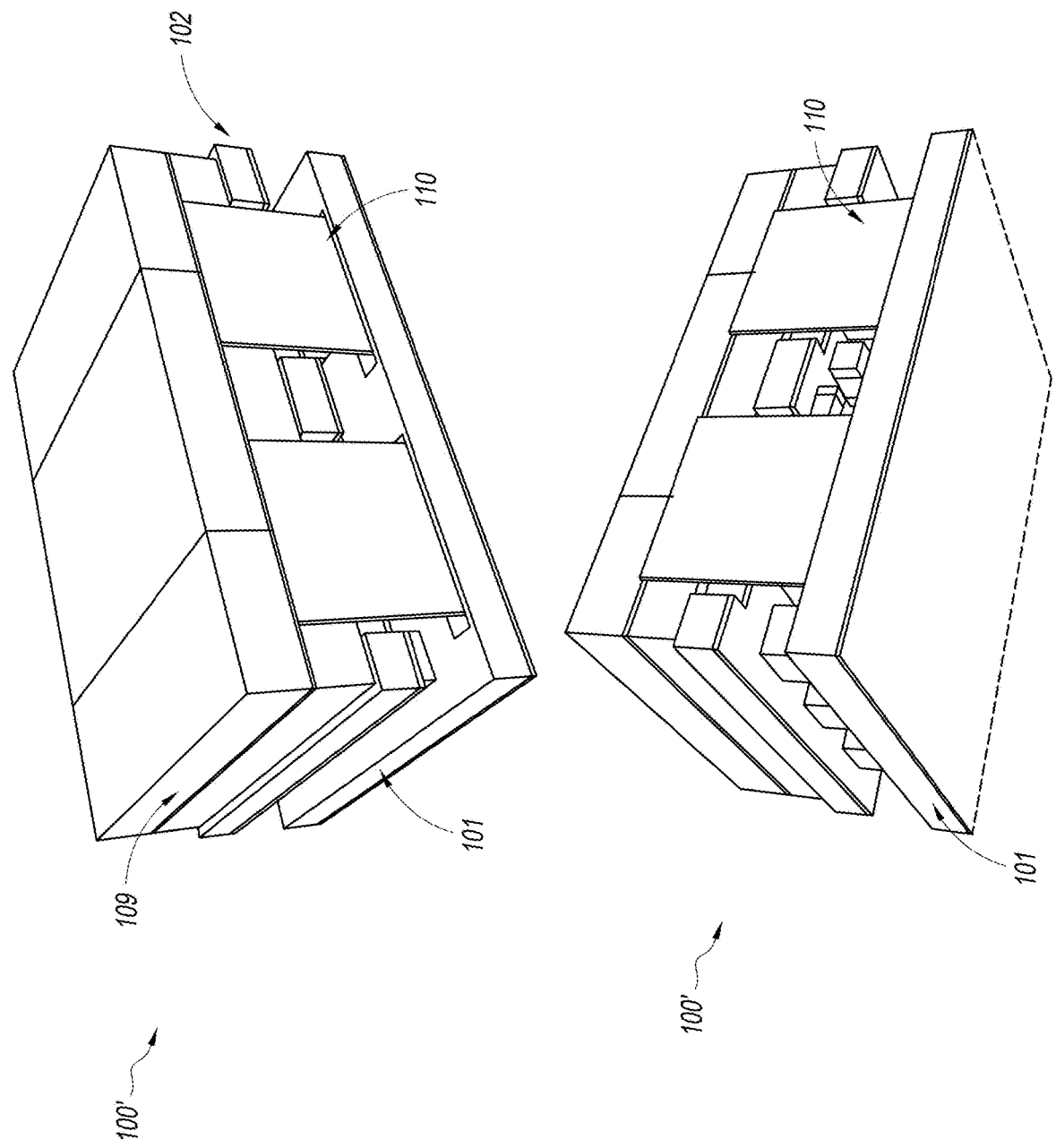

US 11,410,977 B2

ELECTRONIC MODULE FOR HIGH POWER APPLICATIONS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

The field relates to electronic modules for high power applications.

Description of the Related Art

Some packages include an interconnection method and design for μModules that increased power and current capabilities, while at the same time reduced the footprint on the system board. For example, US Patent Publication No. US 2017/0311447 (filed Apr. 24, 2017, hereinafter "the '447 Publication") and U.S. Patent Publication No. US 2019/0304865 (filed Oct. 4, 2018) provide various examples of such package modules, the entire contents of each of which are incorporated by reference herein in their entirety and for all purposes. Some packages similar to those described in the '447 Publication utilize an internal leadframe architecture which can be used to provide an electrical and thermal interconnect between the substrate, inner components, and external components. In a similar and related method, solid conductive components can be used that serve a similar purpose and at the same time provide additional features such as replacement for BGA's and/or connections from an LGA type package to the top of a BGA type package.

SUMMARY

This disclosure relates to high power density packages and package modules (e.g., μModules™ as used herein) that utilize low impedance connections, packages that utilize electrical and/or magnetic isolation, and packages that operate at high thermal performance parameters. This disclosure is also directed to μModule packages with land-grid array (LGA) and/or ball-grid array (BGA) lead configurations that can use an alternative interconnection to a system board or motherboard. This disclosure is also related to three-dimensional (3D) assembled and/or stacked packages with high power and/or high current applications that also use large externally mounted components and incorporate improved heat dissipation.

In one embodiment, an electronic module is disclosed. The electronic module can include a first integrated device package comprising a first substrate, an electronic component mounted to the first substrate, and a first vertical interconnect physically and electrically connected to the first substrate, the first vertical interconnect extending outwardly from the first substrate. The electronic module can include a second integrated device package comprising a second substrate and a second vertical interconnect having a first end electrically connected to the second substrate, the second vertical interconnect having a second end electrically connected to the first vertical interconnect. The first and second vertical interconnects can be disposed between the first and second substrates.

In another embodiment, an electronic module comprises a first integrated device package comprising a first substrate and an electronic component mounted to the substrate. The first integrated device package can comprise a first vertical interconnect physically and electrically connected to the first substrate by a conductive adhesive. The first vertical interconnect can extend outwardly from the first substrate. The first vertical interconnect can be inset from an outermost side surface of the first integrated device package.

In another embodiment, a method of forming an electronic module is disclosed. The method can comprise forming a first integrated device package. Forming the integrated device package can comprise mounting an electronic component to a first substrate. Forming the integrated device package can comprise mounting a first vertical interconnect to the first substrate by a conductive adhesive, the first vertical interconnect extending outwardly from the first substrate, the first vertical interconnect inset from an outermost side surface of the electronic module.

An integrated electronic package comprising at least one solid and/or semi-solid conductive component providing interconnection from the substrate to a leadframe, external board, or any type of externally mounted component including passive, active, and heatsink type components.

An integrated electronic package comprising at least one solid and/or semi-solid conductive component providing interconnection from the internal component to a leadframe, external board, or any type of externally mounted component including passive, active, and heatsink type components.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

Embodiments of this disclosure will now be described, by way of non-limiting example, with reference to the accompanying drawings.

FIG. 8 is a schematic perspective view of the electronic module of FIG. 6 after assembly.

DETAILED DESCRIPTION OF THE PREFERRED EMBODIMENT

Figure 1:
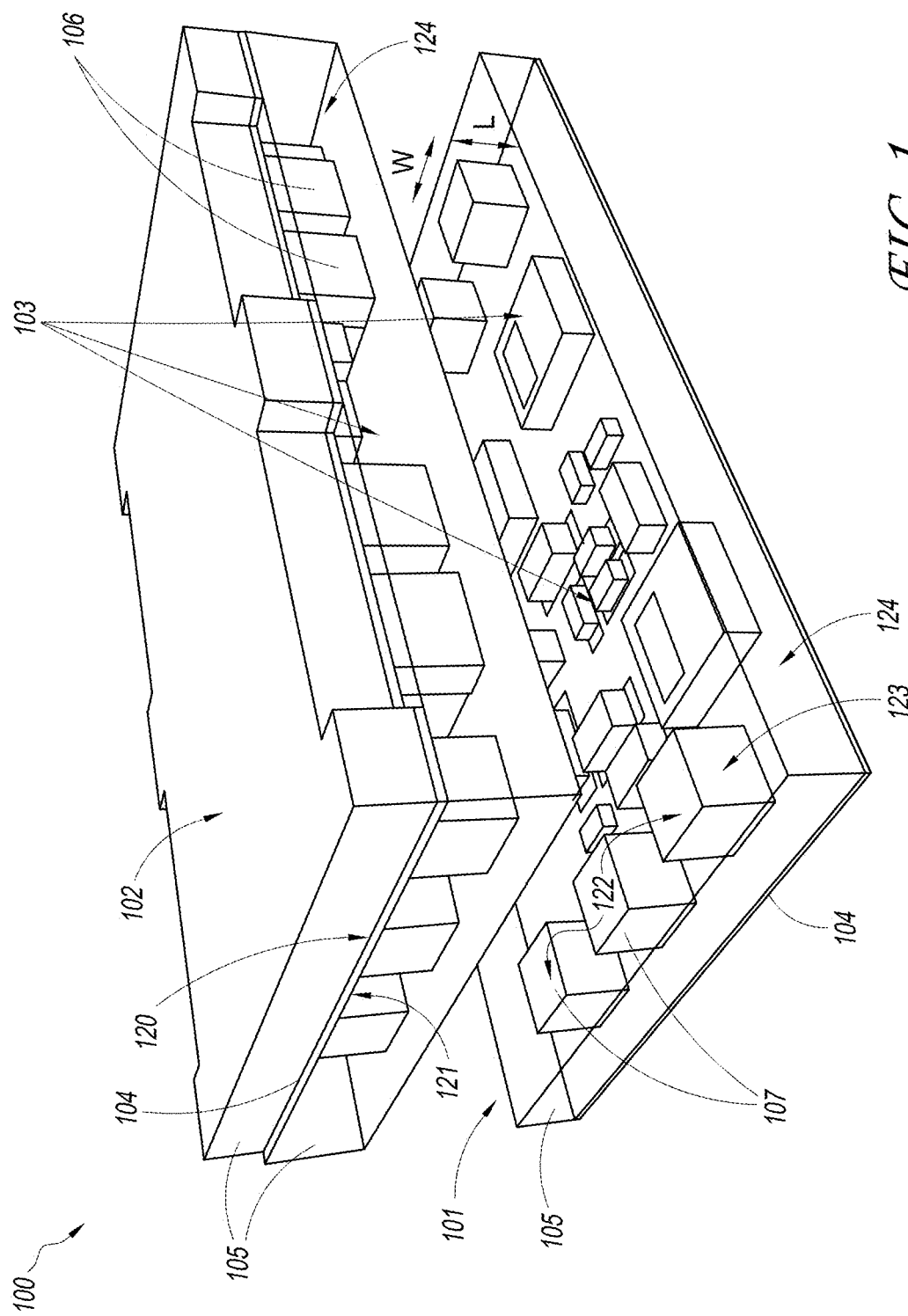
FIG. 1 is a top schematic perspective view of an electronic module according to various embodiments.
Figure 2:
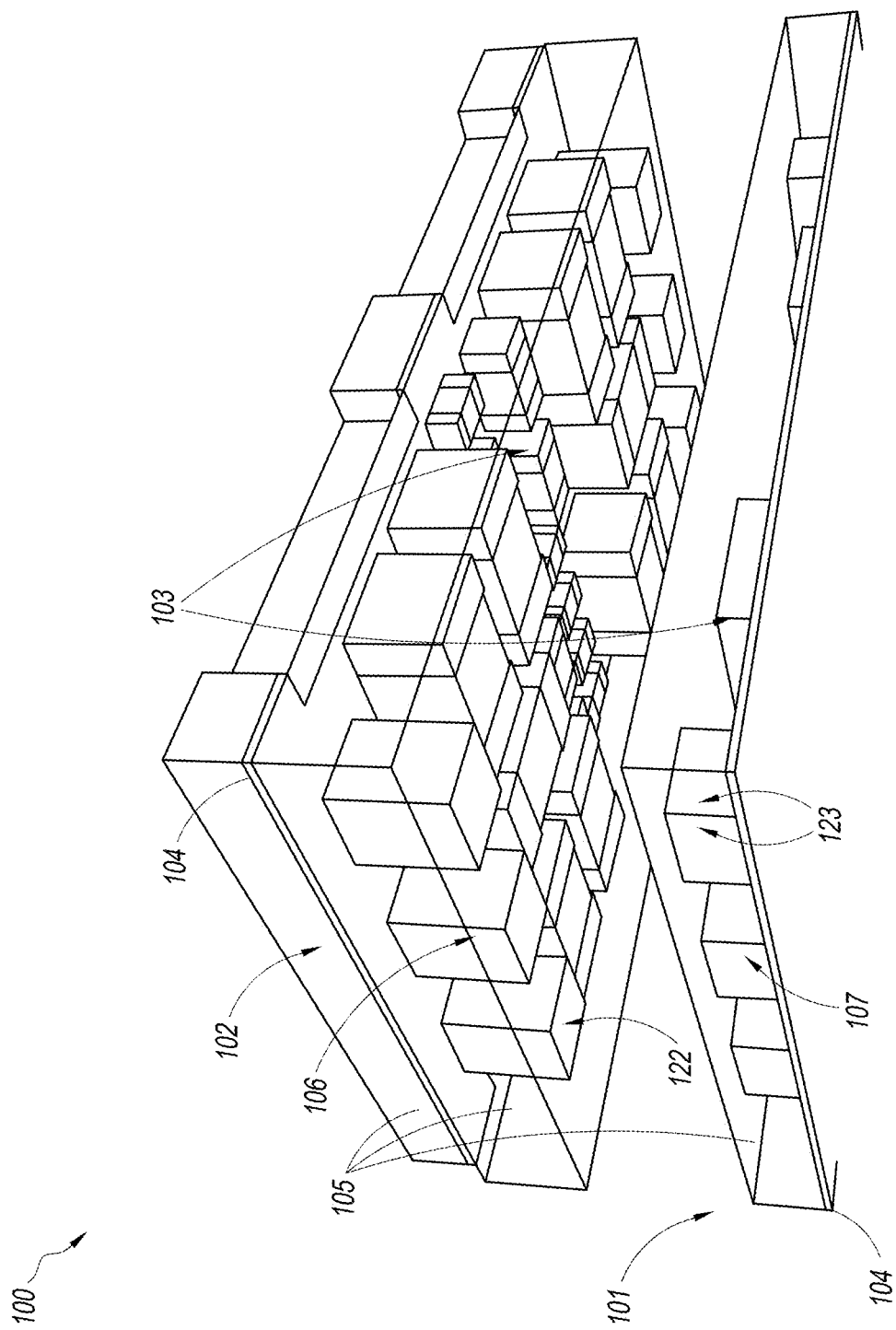
FIG. 2 is a bottom schematic perspective view of the electronic module of FIG. 1.

FIG. 1 illustrates an electronic package module (e.g., a μModule package) 100 that includes two separate integrated device packages 101, 102. The package module 100 can comprise a system-in-package (SIP) infrastructure. FIG. 2 illustrates the package module 100 shown in FIG. 1, shown from a bottom perspective view. The top package 102 of FIG. 1 comprises a substrate 104 (such as a package substrate, e.g., a printed circuit board, or PCB substrate), with surface mount technology (SMT) attached electronic components 103. Although a PCB substrate can be used for the substrate 104 in the example of FIG. 1, in other embodiments, different types of package substrates (such as leadframe substrates, ceramic substrates, etc.) may be used. For example, the electronic components 103 can be attached to pads or leads of the substrate 104 using a conductive adhesive, such as solder, a conductive epoxy, etc. In various embodiments, the components 103 can be pick-and-placed onto the substrate 104. The components 103 can comprise any suitable type of electronic component, such as integrated device die(s), other types of active components, passive components (e.g., resistors, capacitors, inductors, etc.), sensors, microelectromechanical systems (MEMs) components, or any other suitable type of component. In some embodiments, an encapsulant or molding compound 105 may be molded over the components 103, e.g., on only a top side of the package 102, for example, over a top side 120 of the substrate 104. In other embodiments, such as that shown in FIG. 1, the encapsulant or molding compound 105 can be provided on both the top side 120 and a bottom side 121 of the substrate 104, e.g., molded over the top and bottom surfaces of the package 102 to protect the electronic components 103 mounted thereto.

The components 103 and vertical interconnects 106 can be mounted to the bottom surface 121 of the substrate 104. The components can comprise any suitable type of electronic component as explained above, e.g., active or passive electronic components. In some embodiments, the interconnects 106 can be taller than the electronic components 103. For example, as shown the interconnects 106 can extend from the substrate 104 and can extend beyond the components 103. In the illustrated embodiment, the components 103 can be completely embedded in the molding compound 103. The vertical interconnects 106 can be attached to the substrate 104, e.g., using SMT techniques. For example, in various embodiments, the vertical interconnects 106 can be attached to the substrate 104 using a conductive adhesive, such as solder, a conductive epoxy, etc. In various embodiments, the substrate 104 can include embedded conductors to electrically connect the interconnects 106 with the components 103, and/or the components 103 to one another. The vertical interconnects 106 can provide a conductive path and connection (e.g., a solder or other suitable connection) to the bottom package 101. The bottom package 101 can include a molded ball grid array (BGA) package in some embodiments. As with the top package 102, the bottom package 101 can include electronic components 103 mounted to a package substrate 104 of the package 101. Additional vertical interconnects 107 can be mounted to the package substrate 104 (e.g., with a conductive adhesive such as solder, conductive epoxy, etc.) to provide for an exposed connection for conductive attachment to the vertical interconnects 106 of the top package 102 in any suitable manner. For example, exposed surfaces 122 of opposing vertical interconnects 106, 107 can be mechanically and electrically connected, for example, by using solder, conductive epoxy, or any other electrical and thermal connection method used to couple two conductive surfaces together. As shown, in various embodiments, the exposed surfaces 122 can be flush with the outer surface of the molding compound 105. In other embodiments, the vertical interconnects 106, 107 can extend past the outer surface of the molding compound 105.

Beneficially, the vertical interconnects 106 and/or 107 can provide a suitable conductive interface for high currents (e.g., greater than or equal to 5 A, greater than 20 A per connection, greater than 50 A per connection, for example 120 A) extending through the encapsulant or molding compound 105. For example, in some embodiments, each interconnect 106 or 107 can be shaped and selected to enable a current passing therethrough in a range of 1 A to 120 A, in a range of 5 A to 120 A, in a range of 5 A to 100 A, or in a range of 5 A to 50 A. Moreover, the vertical interconnects 106 and/or 107 can be suitably selected to provide efficient thermal pathways from circuit components to an external device, such as a PCB, heat sink, etc. The vertical interconnects 106 and/or 107 can provide a through current pathway to the system motherboard (or to other component). In various embodiments, the vertical interconnects 106 and/or 107 can comprise a material that is conductive and attachable to the substrate 104 or other components. For example, the vertical interconnects 106 and/or 107 can comprise a metal, such as copper, gold, or other suitable metal. In some embodiments, the interconnects 106 and/or 107 can comprise a non-reflowable material that is highly conductive to heat and electricity, for example, copper, gold, silver, etc. In some embodiments, the interconnects 106 and/or 107 can comprise an electroplated plastic, a doped semiconductor (e.g., doped silicon). The interconnects 106 and/or 107 can be attached to the substrates 104, to each other, or to other materials by way of a conductive adhesive (such as solder, a conductive epoxy (e.g., a silver-containing epoxy)). In various embodiments, the interconnects can be sintered to the substrates 104 or to each other, for example using a silver and/or copper mixture. The thermal conductance of the interconnection can have a k-value of greater than or equal to 20.

The interconnects 106 and/or 107 can be picked and placed onto the respective substrates 104 using pick and place techniques, and adhered using the bonding materials and methods described above. Beneficially, the use of pick-and-place techniques can enable the interconnects 106 and/or 107 to be placed at any desirable portion of the substrate 104. In some embodiments the interconnects 106 and/or 107 can be at least partially embedded in an encapsulant or molding compound. The vertical interconnects 106 and/or 107 can have exposed surfaces 122 that can be exposed through the molding compound 105 in any suitable manner for facilitating electrical connections. In various embodiments, a laser deflashing technique or release mold can be used to expose the surfaces 122 of the interconnects 106 and/or 107. In some embodiments, the molding compound or encapsulant 105 can have at least one layer removed (e.g., machined) to at least partially expose the interconnects 106 and/or 107.

As shown in FIG. 1, the interconnects 106, 107 can be completely embedded in the molding compound 105 of the respective packages 101, 102, except for the exposed connection surfaces 122. For example, lateral side surfaces 123 of the interconnects 106, 107 can be embedded in the molding compound 105. Furthermore, as shown in FIGS. 1 and 2, the interconnects 106 and/or 107 can be laterally inset relative to an outermost side surface 124 of the module 100, e.g., such that no portion of the interconnects 106 and/or 107 are exposed on the outermost side surface 124 of the module 100. For example, as shown in FIGS. 1 and 2, the outermost side surface 124 of the module 100 may be at least partially defined by the exterior surface of the mold compound 105 and/or a side surface of the substrate 104. By embedding the interconnects 106 and/or 107 within the molding compound 105 and insetting the interconnects 106 and/or 107 relative to the side surface 124 of the module 100, the risk of shorting to external electrical components (such as components mounted to the system motherboard) can be reduced.

Moreover, in the embodiment of FIGS. 1 and 2, the molding compounds 105 of the respective packages 101, 102 can face one another and/or be disposed adjacent one another. In some arrangements, there may be a small gap between the respective molding compounds 105 of the packages 101, 102 due to, for example, an intervening adhesive (e.g., a conductive adhesive such as solder) that connects the interconnects 106, 107 and which may space the respective molding compounds 105 from one another. In the arrangement of FIGS. 1 and 2, the electronic components 103, vertical interconnects 106, 107, and molding compound 105 can be disposed between the respective substrates 104 of the packages 101, 102.

The vertical interconnects can be generally straight in some embodiments. For example, the interconnects 106, 107 can have a first end attached to the substrate 104 and a second opposite end exposed through the molding compound 105 that includes the exposed surface 122. In some embodiments, at least one line perpendicular to the substrate 104 can extend through both the first and second ends. Moreover, in the illustrated embodiment, the interconnects 106, 107 can be oriented perpendicular to the substrate 104. In some embodiments, a horizontal cross-sectional of the interconnects 106, 107 perpendicular to the length L may not substantially vary along the length L. In various embodiments, the vertical interconnects 106, 107 can comprise pillars that have a rounded (e.g., circular or elliptical) cross-section or a polygonal (e.g., rectangular) cross-section. The vertical interconnects 106, 107 can be wider or can have a larger cross-sectional area than leadframe substrates. The shape and size of the interconnects 106, 107 disclosed herein can beneficially enable high currents through the interconnects 106, 107.

The vertical interconnects 106 and/or 107 can have an aspect ratio defined by the ratio of a height or length L of the interconnects 106 and/or 107 to a width W or diameter of the interconnects 106 and/or 107. The aspect ratio can be greater than 1:1, for example, in a range of 1:1 to 7:1, in a range of 1:1 to 5:1, in a range of 1:1 to 3:1, in a range of 2:1 to 7:1, or in a range of 2:1 to 5:1. In some embodiments, the aspect ratio can be less than 1:1, for example, in a range of 0.2:1 to 1:1. In various embodiments, the length L of the interconnects 106 and/or 107 can be in a range of 0.15 mm to 8 mm, in a range of 0.15 mm to 7 mm, in a range of 0.15 mm to 5 mm, or in a range of 0.5 mm to 5 mm. In various embodiments, a cross-sectional area of the interconnects 106 and/or 107 taken perpendicular to a length L of the interconnects 106 and/or 107 can be at least 0.5 mm$^2$. For example, the cross-sectional area can be in a range of 0.5 mm$^2$ to 9 mm$^2$, in a range of 0.5 mm$^2$ to 5 mm$^2$, or in a range of 0.8 mm$^2$ to 5 mm$^2$. The length L of the interconnects 106, 107 can be in a range of 0.8 mm to 5 mm, in a range of 0.8 mm to 4 mm, in a range of 0.8 mm to 3 mm, in a range of 0.8 mm to 2 mm, in a range of 1 mm to 3 mm, or in a range of 1 mm to 2 mm. In various embodiments, a width W of the interconnects 106, 107 can be in a range of 0.5 mm to 2 mm or in a range of 0.5 mm to 1.5 mm. The use of such relatively large interconnects 106, 107 can beneficially enable the use of high currents through the interconnects 106, 107.

Figure 3:
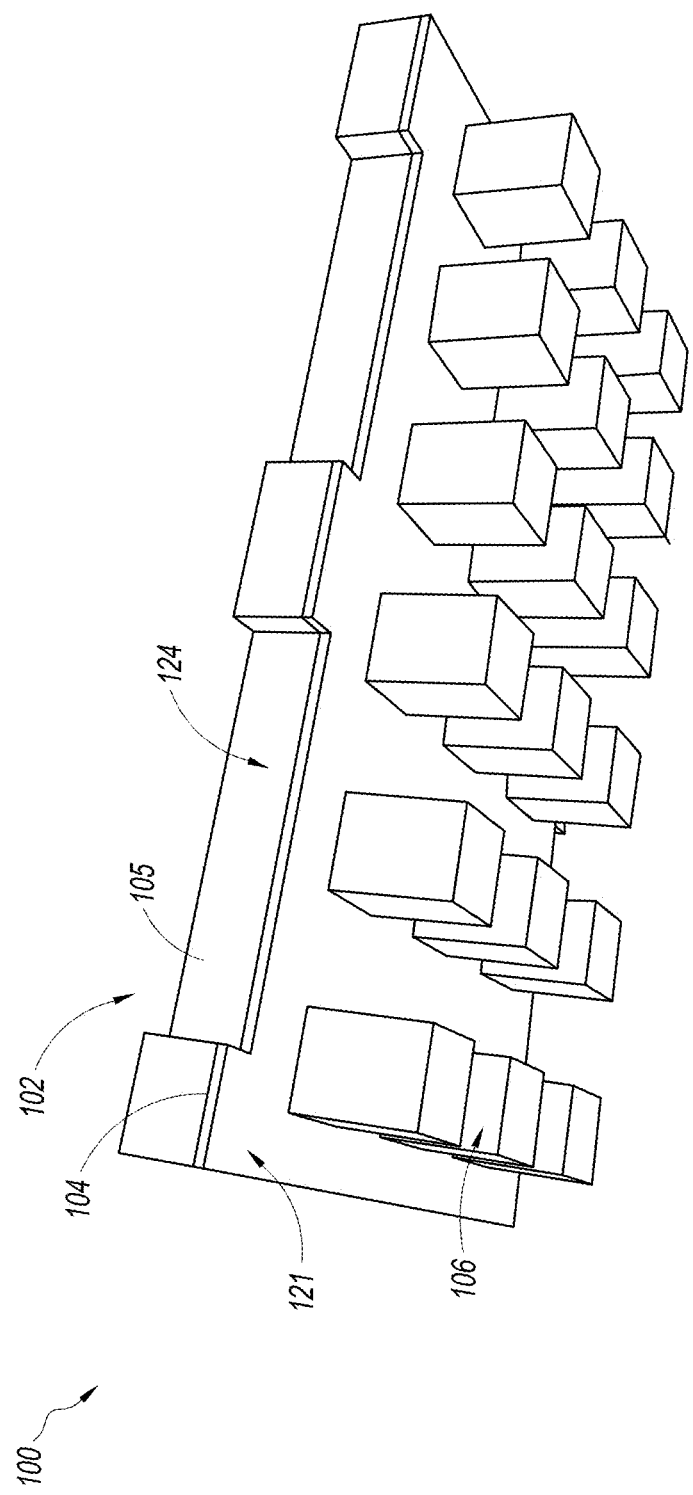
FIG. 3 is a bottom schematic perspective view of an electronic module comprising a device package, according to various embodiments.

FIG. 3 illustrates a package module 100 (e.g., a μModule land grid array-type (LGA-type) package) comprising a package 102 having vertical interconnects 106 attached to provide connection to an external device, such as an external printed circuit board (PCB) (not shown) or to another electronic package (e.g., package 101) with compatible pad size so that a good and reliable conductive connection can be formed. Unless otherwise noted, the components of FIG. 3 may be the same as or generally similar to like-numbered components of FIGS. 1-2. It will be understood that FIG. 3 is shown without the encapsulant or molding compound 105 for purposes of illustration, but in various embodiments, the molding compound 105 can also be provided. The molding compound 105 can be added over the interconnects 106 and subsequently the interconnects can be exposed for connection to the other substrate by, e.g., laser deflash, use of release mold, or removal of a layer of the overmold. Alternatively, the embodiment of FIG. 3 can be used without overmolding (see FIG. 6 and related text). In the illustrated embodiment, the conductive vertical interconnects 106 are attached to form an array. In this manner, this array can replace the typical BGA type package if higher currents and better thermal performance is desired.

The interconnects 106 can be the same as or generally similar to the interconnects 106, 107 described in connection with FIGS. 1 and 2. For example, the interconnects 106 of FIG. 3 can be laterally inset from the outermost side surface 124 of the package 102. The interconnects 106 can be attached to the bottom surface of the substrate 104 using, for example, a conductive adhesive such as solder, conductive epoxy, etc.

Figure 4:
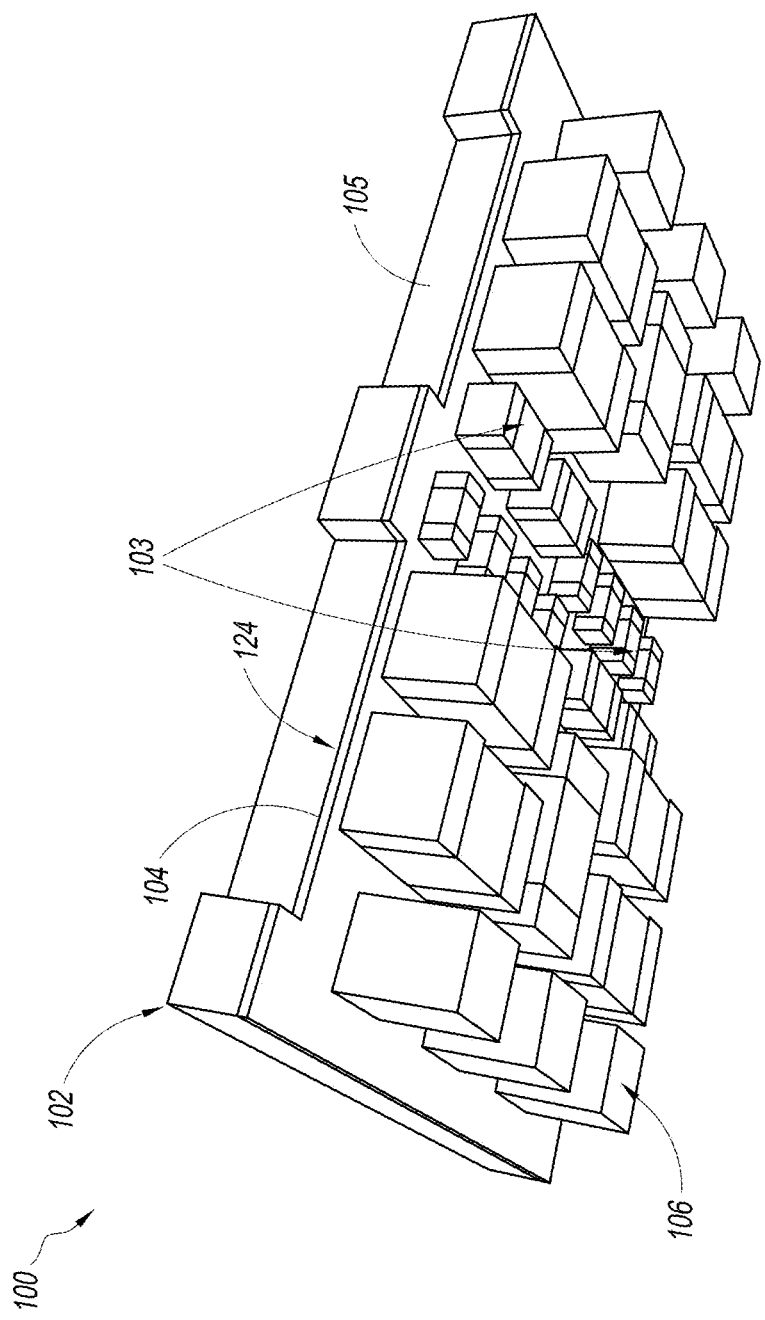
FIG. 4 is a bottom schematic perspective view of an electronic module comprising a device package, according to various embodiments.

FIG. 4 illustrates another example of an electronic module 100 comprising a package 102 with electronic components 103 and with vertical interconnects 106 that can be used for attaching to an external device, such as a package substrate, for example, a printed circuit board (PCB), or that can be attached to another package (such as package 101). Unless otherwise noted, the components of FIG. 4 may be the same as or generally similar to like-numbered components of FIGS. 1-3. It will be understood that FIG. 4 is shown without the encapsulant or molding compound 105 for purposes of illustration, but in various embodiments, the molding compound 105 can also be provided. Alternatively, in other embodiments, there may be no molding compound. In the embodiment of FIG. 4, the electronic components 103 (such as active integrated device dies, passive devices, etc.) can be provided in an interior portion of the package 102, and the interconnects 106, 107 can be provided at outer portions of the package 102. Other configurations may be suitable.

Figure 5:
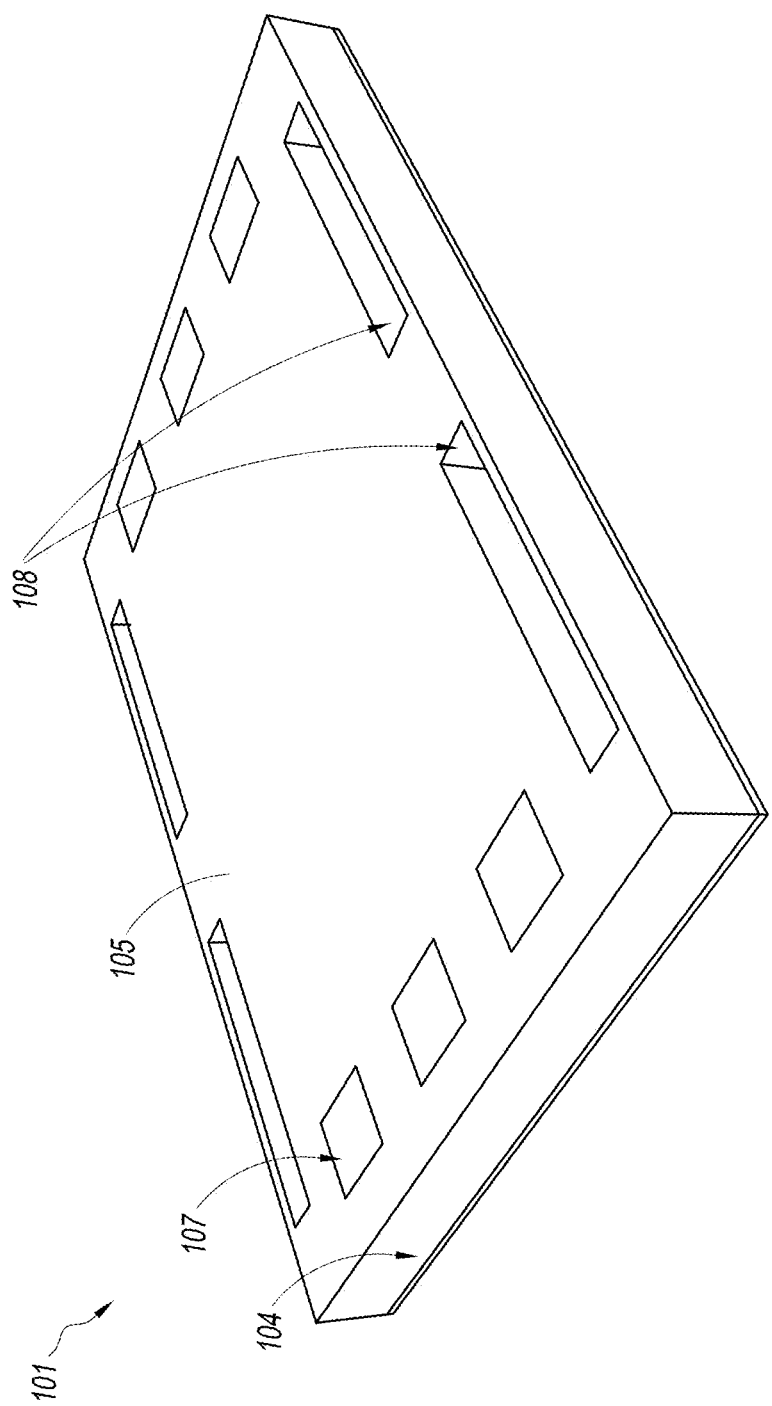
FIG. 5 is a top schematic perspective view of an integrated device package, according to various embodiments.

FIG. 5 is an external view of a package 101 (for example, a μModule package) to which the package 102 in FIG. 4 can attach. For example, in FIG. 5, interconnects 107 can be provided as explained above to electrically and/or thermally connect to the interconnects 106 of FIG. 4. The package module 101 of FIG. 5 also includes laser formed through-mold vias 108 for additional component attachment. For example, in some embodiments, electronic components or connectors may be inserted into or through the vias 108 to connect to another electronic component, system board, etc.

Figure 6:
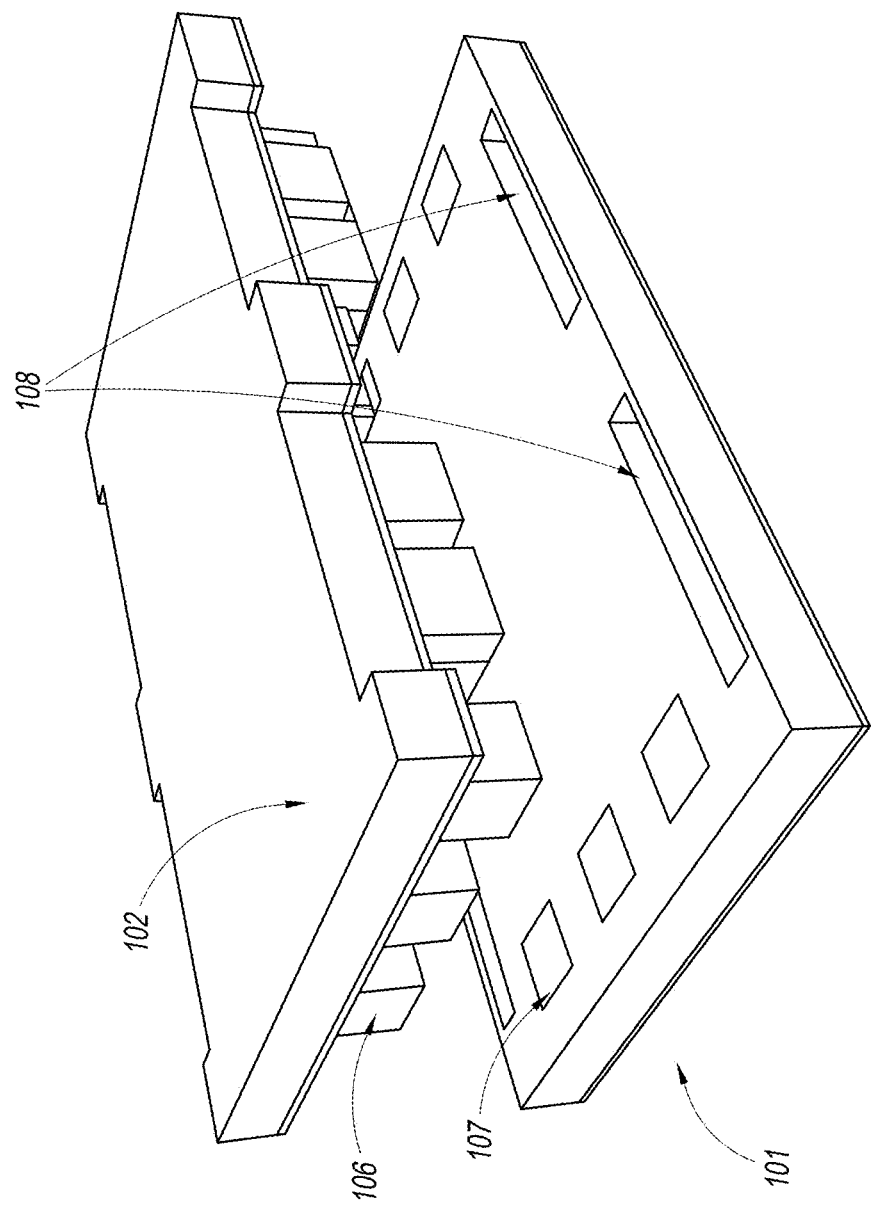
FIG. 6 is a schematic perspective view of an electronic module prior to assembly, according to various embodiments.
Figure 7:
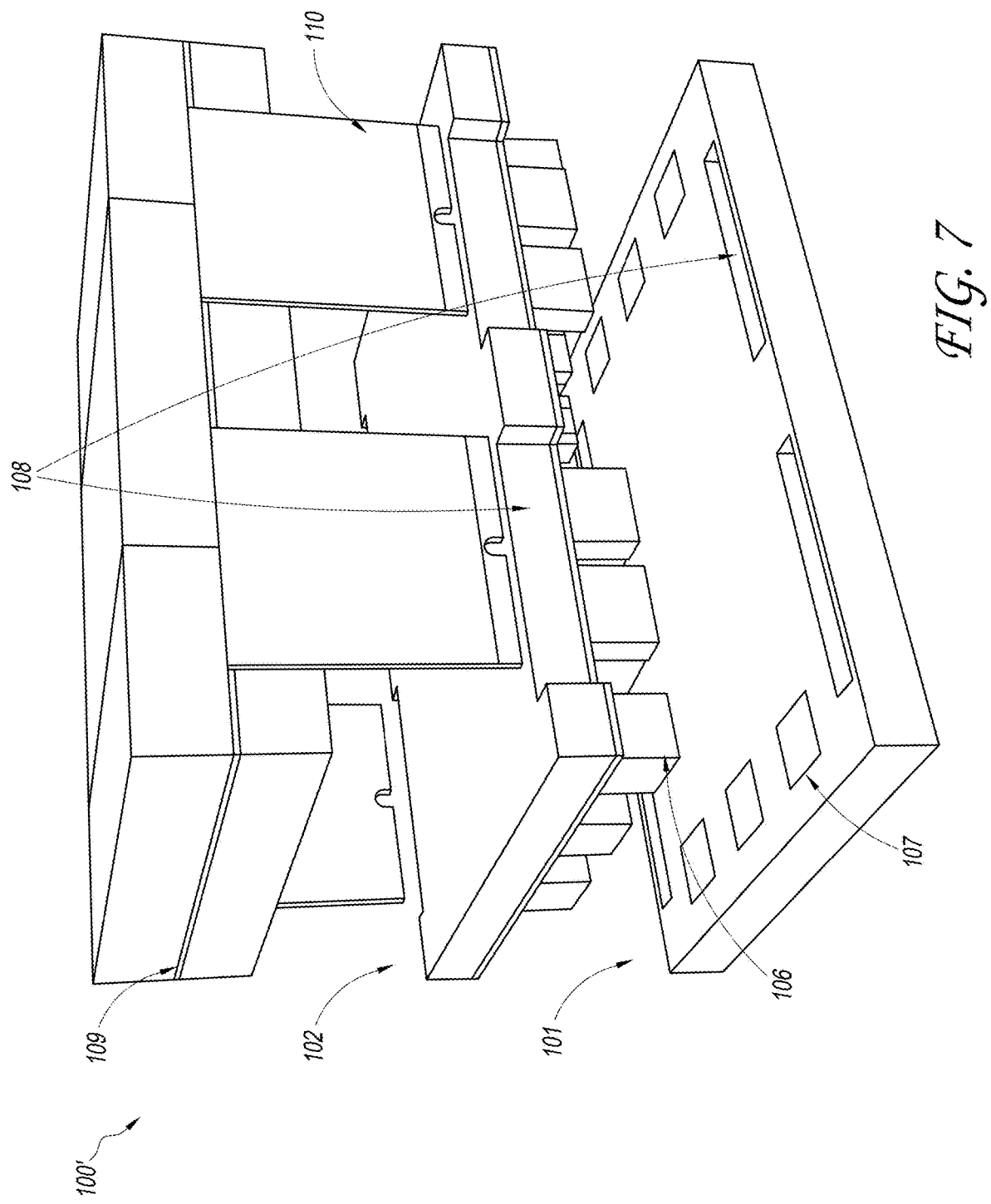
FIG. 7 is a schematic perspective view of the electronic module of FIG. 6 that is configured to connect to an external component.

FIG. 6 shows the packages 102, 101 of FIGS. 4 and 5 to illustrate the assembly of the two packages 102, 101, prior to bonding the interconnects 106, 107. FIG. 7 illustrates a stacked package (e.g., a stacked μModule package) 101, 102 and an external component 109 to be connected to one another to form an electronic module 100' that includes the vertical interconnects 106, 107 described herein. In addition, as explained above, in some embodiments, the external component 109 (such as another integrated device package, an integrated device die, etc.) can electrically connect to the system board or to other components by way of connecting portions 110 that can extend through the slots 108. The embodiments of FIGS. 6 and 7 can include interconnect to interconnect (e.g., through mold interconnects) connections, or interconnect to a contact pad connection through vias in the molding compound. Additional details of the connection of the external component 109 are described in connection with the through-mold via structures with passive component leads that extend through the mold as described in U.S. Patent Publication No. US 2019/0304865 (filed Oct. 4, 2018), which is incorporated by reference herein in its entirety and for all purposes.

FIG. 8 shows an assembled version of the electronic module 100' illustrated in FIG. 7. Multiple variations can take advantage of this vertical interconnect technology to include external heat sink attach, radio frequency (RF) shield or electromagnetic interference (EMI) shield attach, or the attachment of electronic components.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An electronic module comprising:
   a first integrated device package comprising:
      a first substrate;
      an electronic component mounted to the first substrate; and
      a first vertical interconnect physically and electrically connected to the first substrate with a first conductive adhesive, the first vertical interconnect extending outwardly from the first substrate;
   a second integrated device package comprising a second substrate and a second vertical interconnect having a first end electrically connected to the second substrate with a second conductive adhesive, the second vertical interconnect having a second end electrically connected to the first vertical interconnect,
   wherein the first and second vertical interconnects are disposed between the first and second substrates.

2. The electronic module of claim 1, further comprising a first molding compound over at least portions of the electronic component.

3. The electronic module of claim 2, wherein the first vertical interconnect has a first end mounted to the first substrate and a second end exposed through the first molding compound.

4. The electronic module of claim 2, further comprising a second molding compound in which the second vertical interconnect is at least partially embedded.

5. The electronic module of claim 1, wherein the conductive adhesive comprises solder.

6. The electronic module of claim 1, wherein the first vertical interconnect is electrically connected to the second vertical interconnect by a conductive adhesive.

7. The electronic module of claim 1, further comprising a via or slot formed through at least one of the first integrated device package and the second integrated device package.

8. The electronic module of claim 7, further comprising an additional electronic component mounted over the first integrated package module, an interconnection portion of the additional electronic component extending through the via or slot.

9. The electronic module of claim 1, wherein the electronic component comprises an active electronic component or a passive electronic component, and wherein the first interconnect is taller than the electronic component.

10. The electronic module of claim 1, wherein the first vertical interconnect is inset from an outermost side surface of the electronic module.

11. The electronic module of claim 1, wherein the first vertical interconnect has a substantially non-varying horizontal cross-section.

12. The electronic module of claim 1, wherein the first vertical interconnect has an aspect ratio in a range of 1:1 to 7:1.

13. The electronic module of claim 1, wherein the first vertical interconnect has a horizontal cross-sectional area of at least 0.5 mm$^2$.

14. An electronic module comprising:
   a first integrated device package comprising:
      a first substrate;
      an electronic component mounted to the first substrate;
      a first vertical interconnect physically and electrically connected to the first substrate by a conductive adhesive, the first vertical interconnect extending outwardly from the first substrate, the first vertical interconnect inset from an outermost side surface of the first integrated device package; and
      a first molding compound in which the electronic component and the first vertical interconnect are at least partially embedded, the first vertical interconnect having a first end mounted to the first substrate by the conductive adhesive and a second end exposed through the first molding compound.

15. The electronic module of claim 14, further comprising a second integrated device package mounted to the first integrated device package, the second integrated device package having a second interconnect electrically connected to the first vertical interconnect.

16. The electronic module of claim 14, further comprising a package substrate, the first vertical interconnect electrically connected to the package substrate.

17. A method of forming an electronic module, the method comprising:
   forming a first integrated device package, wherein forming the first integrated device package comprises:
      mounting an electronic component to a first substrate;
      mounting a first vertical interconnect to the first substrate by a conductive adhesive, the first vertical interconnect extending outwardly from the first substrate, the first vertical interconnect inset from an outermost side surface of the electronic module; and providing a first molding compound in which the electronic component and the first vertical interconnect are at least partially embedded, the first vertical interconnect having a first end mounted to the first substrate by the conductive adhesive and a second end exposed through the first molding compound.

18. The method of claim 17, further comprising mounting a second integrated device package to the first integrated device package, the second integrated device package having a second interconnect electrically connected to the first vertical interconnect.

\* \* \* \* \*